(12) United States Patent
Högerl et al.

(10) Patent No.: US 6,576,995 B2
(45) Date of Patent: Jun. 10, 2003

(54) HOUSING FOR SEMICONDUCTOR CHIPS

(75) Inventors: Jürgen Högerl, Regensburg (DE); Stefan Paulus, Zeitlarn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/832,246

(22) Filed: Apr. 10, 2001

(65) Prior Publication Data

US 2001/0030359 A1 Oct. 18, 2001

(30) Foreign Application Priority Data

Apr. 10, 2000 (DE) .......................... 100 17 741

(51) Int. Cl.[7] .............................................. H01C 23/04
(52) U.S. Cl. ................. 257/698; 257/782; 257/784; 257/774; 257/787; 257/502
(58) Field of Search .................. 257/723, 782, 257/783, 784, 693, 730, 696, 774, 787, 698, 502

(56) References Cited

U.S. PATENT DOCUMENTS

| | | | |
|---|---|---|---|
| 4,906,802 A | | 3/1990 | Castleman |
| 5,907,151 A | * | 5/1999 | Gramann et al. ........ 250/214.1 |
| 6,020,636 A | * | 2/2000 | Adishian .................... 257/728 |
| RE36,614 E | * | 3/2000 | Lumbard et al. ........... 313/500 |
| 6,057,175 A | * | 5/2000 | Milla et al. ................. 438/113 |
| 6,281,435 B1 | * | 8/2001 | Maekawa ................... 174/52.2 |

FOREIGN PATENT DOCUMENTS

| | | |
|---|---|---|
| DE | 197 28 992 A1 | 1/1999 |
| EP | 0 996 154 A1 | 4/2000 |

\* cited by examiner

*Primary Examiner*—Albert W. Paladini
*Assistant Examiner*—Luan Thai
(74) *Attorney, Agent, or Firm*—Laurence A. Greenberg; Werner H. Stemer; Ralph E. Locher

(57) ABSTRACT

A housing for semiconductor chips includes a plastic base substrate having a region for accommodating a chip and substrate sides having a patterned metallization layer. One of the sides contacts a chip and another contacts an external electrical connection. Each chip has front and rear sides and at least one chip contact on each side. Two or more pads are formed in the patterned metallization layer on one of the base substrate sides. One of the pads is connected to a front side chip contact and another is connected to a rear side chip contact. At least one pad is formed in the patterned metallization layer on the other base substrate side and is connected to the external electrical connection. One of the two pads is connected to a chip contact through the bonding wire, and another of the two pads is directly applied to another chip contact.

5 Claims, 3 Drawing Sheets

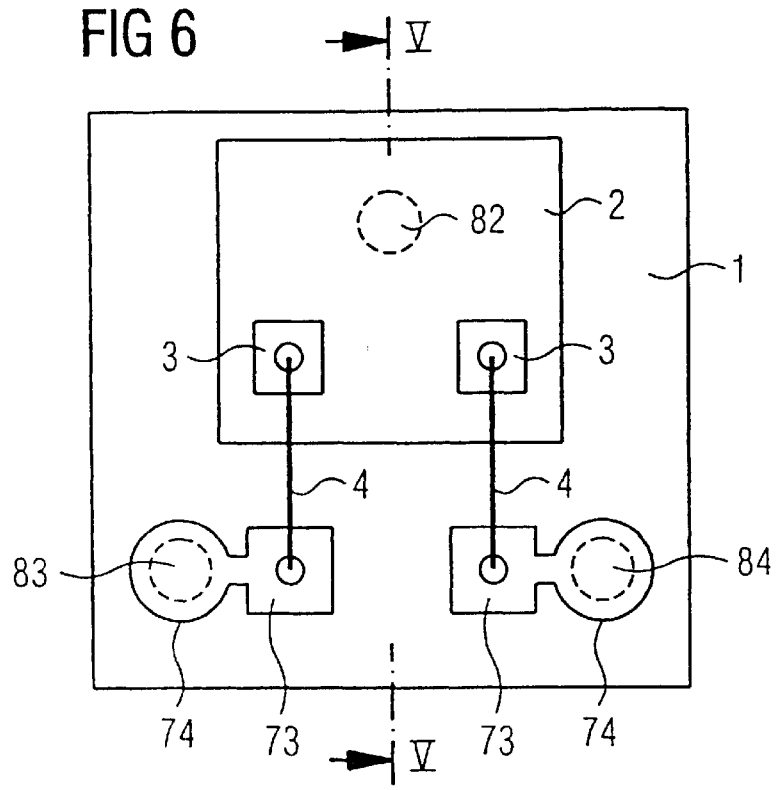
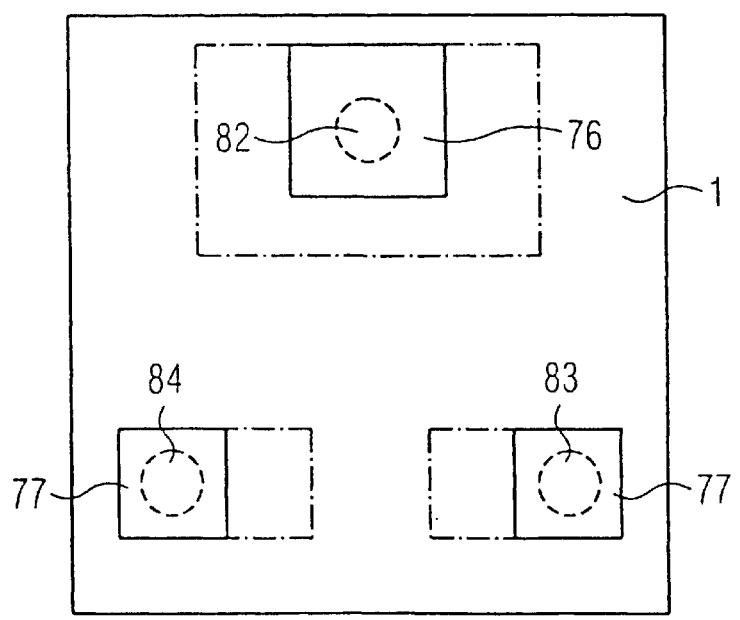

HOUSING FOR SEMICONDUCTOR CHIPS

BACKGROUND OF THE INVENTION

Field of the Invention

The present invention relates to a housing for semiconductor chips that is suitable, in particular, for radio-frequency components.

For mounting semiconductor chips, there are already a series of different housing developments in existence that differ in terms of the configuration of the chip on a carrier substrate and also the electrically conductive connections toward external connections. Usually, a housing is understood to mean just a carrier or a frame suitably patterned with electrical conductors on which the semiconductor chip is fixed and contact-connected and subsequently encapsulated by a potting compound or molding compound.

U.S. Pat. No. 4,906,802 to Castleman describes a chip carrier in which a substrate produced from a casting compound and serving for accommodating a semiconductor chip is provided with electrical conductors on upper sides. European Patent Application EP 0 996 154 A1 describes a semiconductor component on a carrier made of a thermoplastic material. In the carrier, the contacts of a chip are applied by solder bowls on a metallization layer of the surface of the carrier and are electrically conductively connected to connection contacts on the rear side of the carrier by vias through the carrier. German Published, Non-Prosecuted Patent Application DE 197 28 992 A1 describes a housing for a semiconductor body that has a supporting frame made of a plastic. Into the frame is inserted a semiconductor chip with connection elements disposed in cutouts in a passivation layer.

SUMMARY OF THE INVENTION

It is accordingly an object of the invention to provide a housing for semiconductor chips that overcomes the hereinafore-mentioned disadvantages of the heretofore-known devices of this general type and that makes contact on both sides, that can be produced cost-effectively in large numbers, and that affords a high degree of flexibility in the configuration of the electrical connections without additional process complexity.

With the foregoing and other objects in view, there is provided, in accordance with the invention, a housing for semiconductor chips, each chip having a front side, a rear side, and at least one chip contact on each of the front side and the rear side, including a plastic base substrate having at least one region for accommodating a semiconductor chip having a front side with at least one chip contact and a rear side with at least one chip contact, and two mutually opposite sides having a patterned metallization layer, one of the sides contacting the chip and another of the sides contacting an external electrical connection, at least two pads formed in the patterned metallization layer on one of the sides of the base substrate, one of the two pads connected to the at least one chip contact on the front side of the chip and another of the two pads connected to the at least one chip contact on the rear side of the chip, at least one pad formed in the patterned metallization layer on another of the sides of the base substrate, the at least one pad connected to the external electrical connection, a bonding wire, one of the two pads connected to a chip contact of the chip through the bonding wire, and another of the two pads directly applied to another chip contact of the chip.

The housing according to the invention uses a base substrate made of plastic. The substrate can be produced cost-effectively in large numbers, e.g., in a conventional injection-molding method. The base substrate is provided with suitably patterned metal layers on its surfaces. The metal layers are provided as pads and as conductor tracks. The base substrate preferably has at least one recess or cutout into which a semiconductor chip is inserted.

The dimensions and the patterning of the base substrate may be chosen such that it serves as housing for a multiplicity of semiconductor chips. After the insertion of the semiconductor chips and the contact-making process, and also, if appropriate, after further production steps that are required, the portions of the base substrate that are provided for the individual components can be separated from one another and the envisaged individual housings with respective components can, thus, be separated. The simplest way of accomplishing the separation is by sawing, breaking, or stamping, preferably, at emplacement regions or desired breaking points provided on the base substrate for the tool used. The base substrate that forms the starting point for production is, therefore, preferably an array of separable chip housings.

The base substrate may be provided with vias as early as during production. The vias later enable electrical connections from pads on the front side to pads on the rear side of the substrate. The channels required for the vias in the plastic material may already be formed during the production of the plastic body of the base substrate, e.g., by using a suitable mold for an injection-molding method. Instead, the channels can be produced subsequently by drilling or etching in the base substrate.

A preferred production method provides for the surface of the base substrate to be completely metallized. The plastic surface is provided with a thin metal layer, for example, by electro-deposition. The applied metal layer is patterned subsequently, which can be done, e.g., with the aid of writing lasers or lithographic (etching) methods. In principle, however, it is also possible to use a suitably adapted mask technique to apply the metal layer already with the envisaged structure. The patterned metal layer is preferably produced on the front side—provided for the fitting of a semiconductor chip—and the opposite rear side of the substrate. For an electrically conductive connection between a pad of the metal layer on the front side to a pad on the rear side, the metal is also introduced into the channels provided for the vias. If no such channels are provided, a corresponding conductive connection between the front side and the rear side of the substrate can also be implemented by suitably patterned conductor tracks that are formed in the applied metal layer and are present on the side walls of the base substrate.

The pads that are patterned on the rear side of the base substrate in the applied metal layer are suitably configured for making electrical contact with corresponding pads, e.g., on a printed circuit board. The pads on the base substrate may have any desired geometrical shapes. In addition, the pads may be provided with conventional protection against corrosion, e.g., gold plating.

In accordance with another feature of the invention, the at least one first pad is electrically connected to the at least one chip contact and the at least one second pad is electrically connected to the external conductor.

In accordance with a further feature of the invention, the one of the two pads is connected to the at least one chip contact on the front side of the chip through the bonding wire, and the another of the two pads is directly applied to the at least one chip contact on the rear side of the chip.

In accordance with an added feature of the invention, the metallization layer is disposed a surface of the base substrate, and at least a part of the metallization layer forms an electrically conductive connection between at least one of the at least two pads and at least one of the at least one pad.

In accordance with an additional feature of the invention, the base substrate has at least one channel connecting the two mutually opposite sides, and metal introduced into the at least one channel forms at least one via electrically connecting at least one of the at least two pads to at least one of the at least one pad.

In accordance with a concomitant feature of the invention, the base substrate has a height no greater than 2 mm, a width no greater than 2 mm, and a depth no greater than 2 mm.

The housing according to the invention can, therefore, be produced in large numbers in a comparatively simple manner using conventional method steps. There is obviously great freedom in the patterning of the housing itself for accommodating a wide variety of semiconductor chips and in the patterning of the electrical contacts and wiring. Furthermore, the housing can be adapted practically to arbitrarily configured sub carriers, printed circuit boards, lead frames, or closed housings. To protect the respective semiconductor chip, the chip can be encapsulated by a potting compound that is preferably pressed into a cutout in the base substrate, into which cutout the semiconductor chip is inserted, after the chip has been inserted.

Other features that are considered as characteristic for the invention are set forth in the appended claims.

Although the invention is illustrated and described herein as embodied in a housing for semiconductor chips, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 6 is an upper elevational view of the configuration of FIG. 5; and

FIG. 7 is a lower elevational view of the configuration of FIG. 5.

DESCRIPTION OF THE PREFERRED EMBODIMENTS

Figure 1:
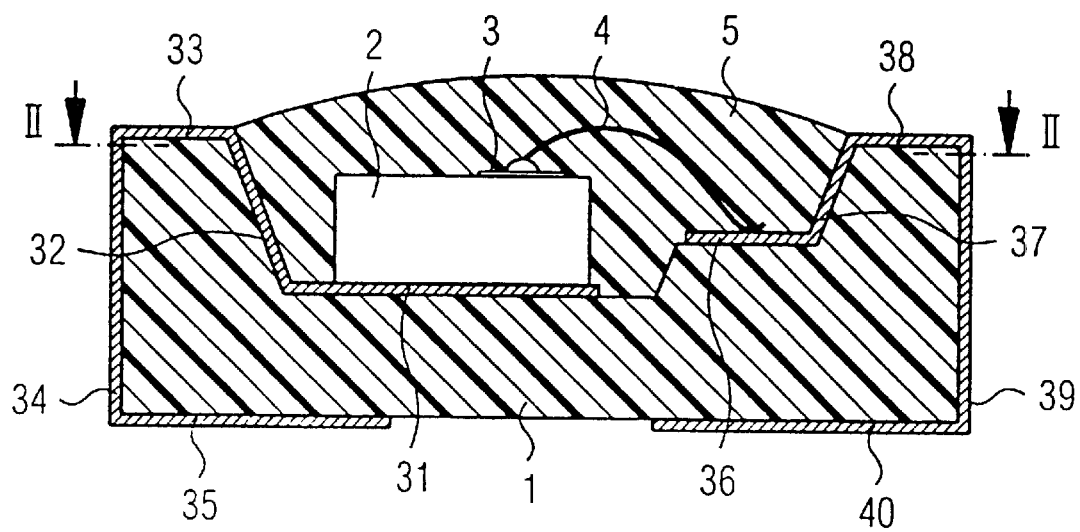
FIG. 1 is a cross-sectional view of a configuration with a housing according to the invention and a semiconductor chip inserted therein.

In all the figures of the drawing, sub-features and integral parts that correspond to one another bear the same reference symbol in each case.

Referring now to the figures of the drawings in detail and first, particularly to FIG. 1 thereof, there is shown a cross-section of a base substrate 1 made of plastic. The base substrate 1 is provided with a cutout into which a chip 2 is inserted. The upper sides of the base substrate 1 are provided with metallization layers that are patterned for electrical connection of the chip 2. A first portion 31 of the metallization layers is situated on the bottom of the cutout provided for the chip 2 so that any rear side contacts of the chip 2 that are present can be electrically conductively connected there to the metallization layer. The first portion 31 of the metallization layer is routed through a second portion 32 on the side wall of the cutout that is shown on the left in FIG. 1. A third portion 33 is present on the front side of the base substrate 1. A fourth portion 34 of the metallization layer is present on the outer side wall of the base substrate 1 (on the left of FIG. 1) as far as a fifth portion 35 that is present on the rear side of the base substrate 1 to produce an electrical contact, e.g., to a pad of a printed circuit board. In the example, a chip contact 3 is situated on the upper side of the chip 2. The chip contact 3 is electrically conductively connected to a sixth portion 36 of the metallization layer through a bonding wire 4. To be able likewise to accommodate the bonding wire 4 in a protected manner in the cutout provided for the chip 2 and, in addition, to facilitate the fixing of the bonding wire on the sixth portion 36 of the metallization layer, in the region of the sixth portion 36 of the metallization layer the cutout in the base substrate 1 is formed with a step. The sixth portion 36 of the metallization layer is routed through a seventh portion 37 on a side wall of the cutout (shown on the right of FIG. 1). The seventh portion 37 adjoins, on the front side of the base substrate, an eighth portion 38 of the metallization layer, which is joined to a ninth portion 39 present on the outer side wall (to the right of FIG. 1) of the base substrate. The ninth portion is connected to a tenth portion 40 of the metallization layer as a further pad on the rear side of the base substrate 1.

Connection contacts both on the front side and on the rear side of the chip 2 to be mounted can, with the housing according to the invention, be electrically conductively connected in a simple manner to pads that can be contact-connected directly on pads of a printed circuit board or a lead frame. FIG. 1 also depicts a potting compound 5 that fills the cutout and protects the chip 2 and any bonding wires that are present against the outside.

Figure 2:
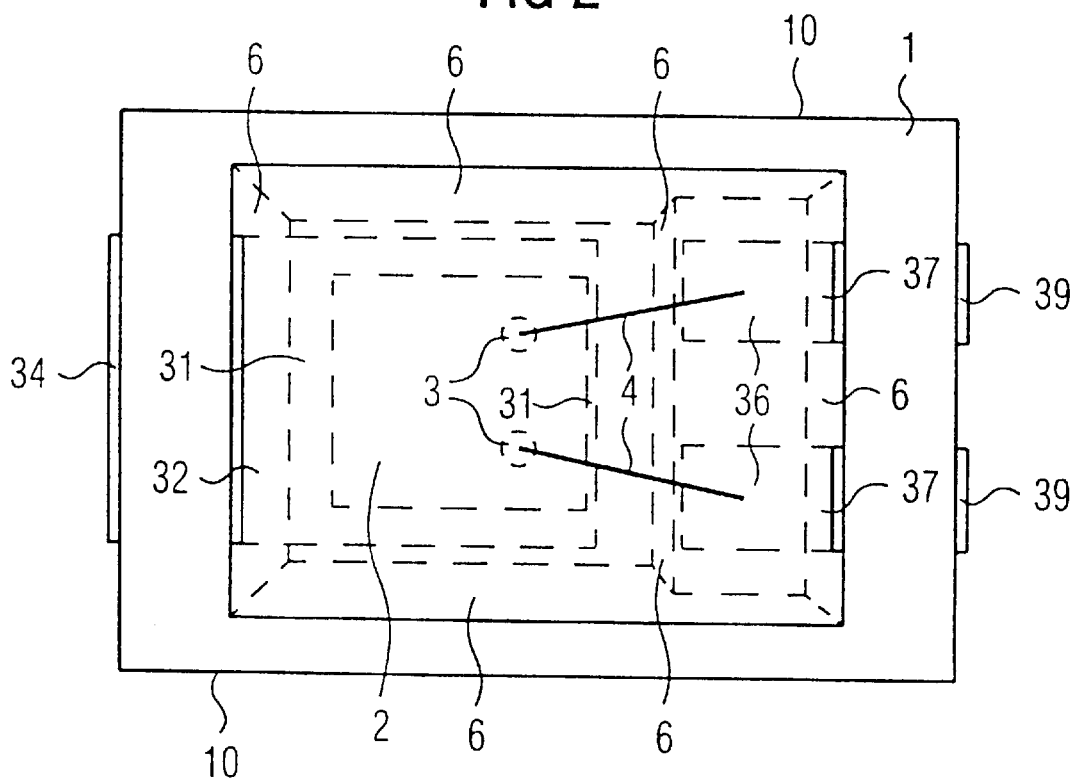
FIG. 2 is a cross-section view of the configuration of FIG. 1 along the line II–II in FIG. 1.

FIG. 2 illustrates a cross-section of the configuration of FIG. 1 along the dash-dotted line II. The contours concealed by the potting compound are depicted by dashed lines in FIG. 2. The inclined side walls 6 of the cutout present in the base substrate 1 can be discerned in FIG. 2. The chip 2 has two chip contacts 3 that are respectively connected through a bonding wire 4, represented by a straight solid line for the sake of simplicity, to a pad provided by a sixth portion 36 of the metallization layer. The individual portions of the metal layer illustrated in FIG. 1 are provided with the same reference symbols in FIG. 2, so that mutually corresponding portions can be assigned without further explanations.

The configuration illustrated in FIG. 2 can be produced, for example, according to the following text.

First, proceeding from a base substrate provided for a multiplicity of semiconductor chips, the metallization layer is applied and patterned, and the semiconductor chips are inserted into a respective cutout that is provided and are contact-connected. Second, the individual components are separated into a respective configuration in accordance with FIGS. 1 and 2, for example, by being sawn through along the lateral interfaces 10 (see FIG. 2) of the plastic bodies of the base substrate 1. If, in the case where vias disposed in channels are used, the metallization layers on the side areas are omitted (fourth portion 34 and ninth portion 39), the constituent parts of the base substrate 1 that are to be separated may be disposed vertically and horizontally in rows. The base substrate is then separated, for example, by sawing, along the side areas 10 into two, for example, mutually perpendicular, directions.

Figure 3:
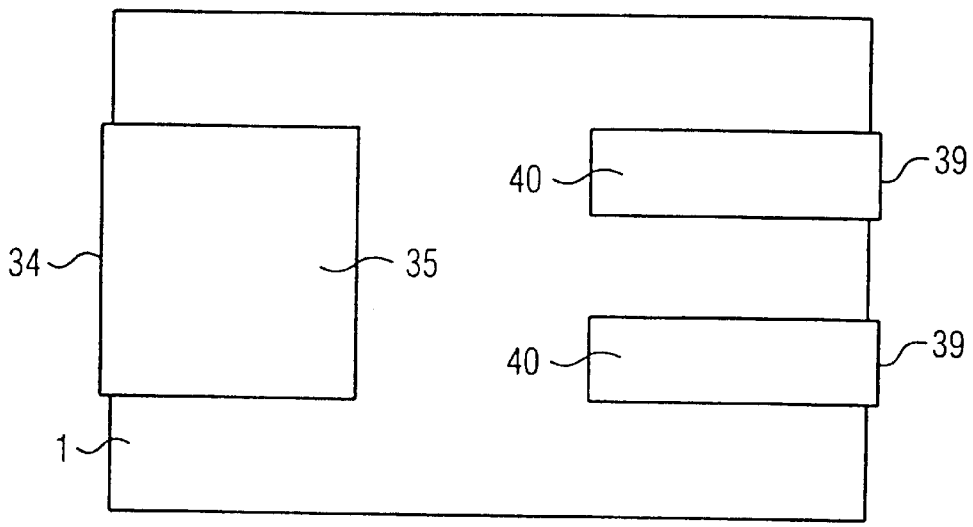
FIG. 3 is a bottom elevational view of the embodiment of FIG. 1.

FIG. 3 shows a rear view of the embodiment of FIG. 1. It reveals how the fourth portion 34 and the ninth portion 39 of the metal layer are electrically conductively connected to a fifth portion 35 and a tenth portion 40 of the metal layer, which form pads on the rear side of the base substrate 1.

Figure 4:
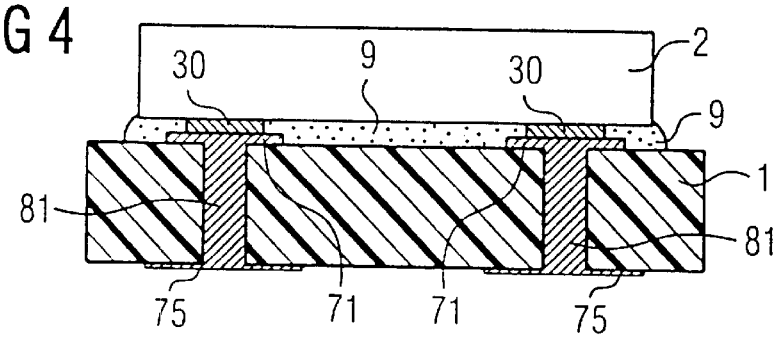
FIG. 4 is a cross-sectional view of an alternative embodiment of the housing according to the invention with vias.

FIG. 4 illustrates a cross-section through another exemplary embodiment, in which there are electrically conductive vias 81 instead of the metal layer on the side walls of the base substrate 1. The vias 81 electrically conductively connect pads 71, 75 on the front side of the base substrate and rear side of the base substrate to one another through the plastic material of the base substrate 1. In the embodiment of FIG. 4, a chip 2 with chip contacts 30 makes contact with the pads 71 on the front side of the base substrate 1 in a flip-chip mount. A filling compound 9 (underfill) closes up the interspace between the base substrate 1 and the chip 2.

Figure 5:
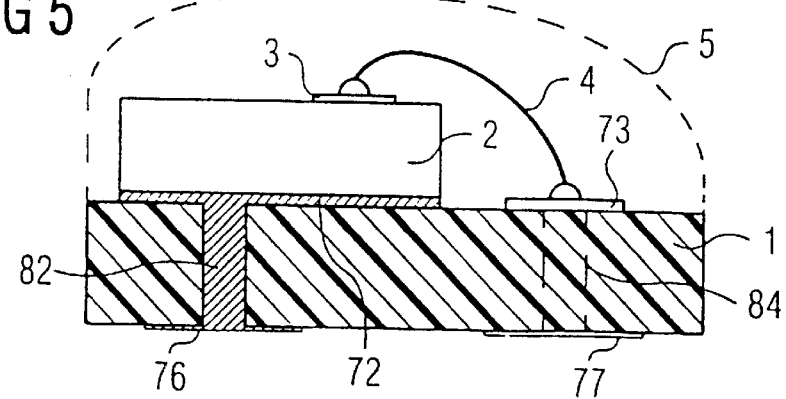
FIG. 5 is a cross-sectional view of a further embodiment of the housing according to the invention with vias and an alternative chip contact connection.

FIG. 5 illustrates a similar exemplary embodiment, in which the chip 2 makes electrically conductive contact with the base substrate 1 both by a chip contact 3 on the front side and by a contact area on the rear side. The chip 2 is fitted on a pad 72—having relatively large dimensions—of the base substrate 1. The pad 72 is electrically conductively connected to an associated rear-side pad 76 by a via 82. In the example, the chip contact 3 present on the front side of the chip is electrically conductively connected to a front-side pad 73 of the base substrate 1 by a bonding wire 4. A further via 84 is present to connect the pad 73 to an assigned pad 77 on the rear side of the base substrate 1. A potting compound 5 may be used to enclose the chip 2. Such a potting compound 5 encapsulating the chip 2 may also be present in the example of FIG. 4.

FIG. 6 shows the embodiment of FIG. 5 in a view without any potting compound 5. The contour of the potting compound 5 is depicted only by dashed lines. The cross-section illustrated in FIG. 5 is denoted by the dash-dotted line V–V in FIG. 6. Because the further via 84 only appears as a concealed contour in FIG. 5, as can be discerned from FIG. 6, the boundary of the via 84 is only indicated by dashed lines in FIG. 5. FIG. 6 shows the front side—which is square in the example but, in principle, can be configured in any desired geometrical shape—of the base substrate 1 with the chip 2 fitted thereon. In the example, the chip has two front-side chip contacts 3 that are electrically conductively connected to a respective pad 73 on the front side of the base substrate by bonding wires 4. The pads 73 are electrically conductively connected to further pads 74 on the front side of the base substrate 1. Situated under the further pads 74 are the vias 83, 84, which are cylindrical in the example and whose contours (concealed in the view illustrated in FIG. 6) are represented by dashed circles. The via 82 leading from a rear-side connection of the chip 2 through the pad 72 to the rear-side pad 76 of the base substrate is likewise a concealed contour and is represented by a dashed circle in FIG. 6. The embodiment of FIG. 6 illustrates that the pads 73 provided on the front side of the base substrate for electrical connection of the chip need not be provided directly with vias to the rear side of the base substrate. Therefore, for the configuration of the front-side and rear-side pads 71, 72, 73, 74, 75, 76, 77, there is wide leeway available for adapting the patterning of the metallization layer of the base substrate.

FIG. 7 shows the rear side of the base substrate 1 of the embodiment of FIGS. 5 and 6. The described vias 82, 83, 84 are contours concealed by the pads 76, 77 and are likewise represented by dashed circles. The dash-dotted contours indicate that the pads 76, 77 can, in principle, be configured as desired. Therefore, the lateral dimensions can be ideally adapted to the pads of an external housing or of a printed circuit board such that direct electrical contact can be produced, e.g., by a soft solder inserted between the pads.

The advantages of the housing according to the invention reside, in particular, in the possibility of cost-effective production of the base substrate made of plastic. The advantage is manifested, in particular, when the largest possible number of separate housings is produced from an original base substrate. The simultaneous patterning of the pads toward the printed circuit board obviates complex process steps that are otherwise necessary for the separate fitting of contacts. Further, the configuration of the pads on the rear side of the base substrate reduces the housing dimensions. The production process also only requires conventional process steps. The various exemplary embodiments of the housing result from modification of the form of the plastic body and of the patterning of the metallization layer. Therefore, the housing can be adapted very easily to different chip dimensions and contact configurations. That applies, in particular, to the size of the pads and the dimensioning, in particular, the thickness, of the chip. Moreover, it is possible to form housings for multichip modules by using a plurality of connection positions (pads, cutouts) in the base substrate. Moreover, the chips accommodated in a housing can be electrically conductively connected to one another through the patterned metal layer. The connection, too, does not require any method steps that go beyond the customary process sequence for producing the housing according to the invention.

We claim:

1. A housing for semiconductor chips, each chip having a front side, a rear side, and at least one chip contact on each of the front side and the rear side, comprising:
a plastic base substrate having:
a height no greater than 2 mm, a width no greater than 2 mm, and a depth no greater than 2 mm;
at least one region for accommodating a semiconductor chip having a front side with at least one chip contact and a rear side with at least one chip contact;
two mutually opposite sides having a patterned metallization layer, one of said sides contacting the chip and another of said sides contacting an external electrical connection; and
at least one channel connecting said two mutually opposite sides;
at least two pads formed in said patterned metallization layer on one of said sides of said base substrate, one of said two pads connected to the at least one chip contact on the front side of the chip and another of said two pads connected to the at least one chip contact on the rear side of the chip;
at least one pad formed in said patterned metallization layer on another of said sides of said base substrate, said at least one pad connected to the external electrical connection;
metal introduced into said at least one channel forming at least one via electrically connecting at least one of said at least two pads to at least one of said at least one pad;
a bonding wire;
one of said two pads connected to a chip contact of the chip through said bonding wire; and another of said two pads directly applied to another chip contact of the chip.

2. The housing according to claim 1, wherein said one of said two pads is connected to the at least one chip contact on the front side of the chip through said bonding wire; and said another of said two pads is directly applied to the at least one chip contact on the rear side of the chip.

3. The housing according to claim 1, wherein:

said base substrate has a surface;

said metallization layer is disposed said surface; and at least a part of said metallization layer forms an electrically conductive connection between at least one of said at least two pads and at least one of said at least one pad.

4. The housing according to claim 1, wherein at least a connecting contact of the chip is directly connected with said at least one via through said substrate without bonding wire.

5. A housing for semiconductor chips, each chip having a front side, a rear side, and at least one chip contact on each of the front side and the rear side, comprising:

a plastic base substrate having:

a height no greater than 2 mm, a width no greater than 2 mm, and a depth no great than 2 mm;

at least one region for accommodating a semiconductor chip having a front side with at least one chip contact and a rear side with at least one chip contact; and two mutually opposite sides having a patterned metallization layer, one of said sides contacting the chip and another of said sides contacting an external electrical connection; and at least one channel connecting said two mutually opposite sides;

two pads formed in said patterned metallization layer on one of said sides of said base substrate, one of said two pads connected to one chip contact on the front side of the chip and another of said two pads connected to one chip contact on the rear side of the chip;

at least one pad formed in said patterned metallization layer on another of said sides of said base substrate, said at least one pad connected to the external electrical connection;

metal introduced into said at least one channel forming at least one via electrically connecting at least one of said at least two pads to at least one of said at least one pad;

a bonding wire;

one of said two pads connected to said one chip contact on the front side of the chip through said bonding wire; and another of said two pads directly applied to said one chip contact on the rear side of the chip.

* * * * *